(12) United States Patent
Chan et al.

(10) Patent No.: US 10,329,660 B2
(45) Date of Patent: Jun. 25, 2019

(54) FLEXIBLE TRANSPARENT THIN FILM

(71) Applicants: Mind Technology Development Limited, Hong Kong (HK); New Asia Group Holdings Limited, Hong Kong (HK)

(72) Inventors: Chung Pui Chan, Hong Kong (HK); Lai Fan Lai, Hong Kong (HK); Wing Hong Choi, Hong Kong (HK); Bin Zhang, Hong Kong (HK); Kwok Keung Paul Ho, Hong Kong (HK); Chien Chung, Hong Kong (HK); Chun Pong Lee, Hong Kong (HK)

(73) Assignees: MIND TECHNOLOGY DEVELOPMENT LIMITED, Hong Kong (HK); NEW ASIA GROUP HOLDINGS LIMITED, Hong Kong (HK)

( * ) Notice: Subject to any disclaimer, the term of this patent is extended or adjusted under 35 U.S.C. 154(b) by 0 days.

(21) Appl. No.: 15/648,444

(22) Filed: Jul. 12, 2017

(65) Prior Publication Data
US 2018/0291498 A1 Oct. 11, 2018

Related U.S. Application Data

(60) Provisional application No. 62/483,321, filed on Apr. 7, 2017.

(51) Int. Cl.
*C23C 4/06* (2016.01)
*C23C 14/16* (2006.01)
(Continued)

(52) U.S. Cl.
CPC .............. *C23C 14/16* (2013.01); *C08K 3/08* (2013.01); *C09D 133/02* (2013.01); *C23C 4/06* (2013.01);
(Continued)

(58) Field of Classification Search
None
See application file for complete search history.

(56) References Cited

U.S. PATENT DOCUMENTS

| 8,492,189 B2 | 7/2013 | Sun et al. |
| 9,244,356 B1 | 1/2016 | Kobrin et al. |
(Continued)

FOREIGN PATENT DOCUMENTS

| CN | 103864062 B | 7/2015 |
| CN | 104992752 A | 10/2015 |
(Continued)

OTHER PUBLICATIONS

Won-Kyung Kim et. al., "Cu Mesh for Flexible Transparent Conductive Electrodes", Scientific Reports, 5, Jun. 3, 2015, Article No. 10715, p. 1-8.
(Continued)

*Primary Examiner* — Ashok Patel
(74) *Attorney, Agent, or Firm* — Idea Intellectual Limited; Margaret A. Burke; Sam T. Yip

(57) ABSTRACT

The present invention provides a transparent conductive thin film which is flexible for suiting substantially all kinds of electronic and optoelectronic devices or display panel. The present conductive thin film includes at least one transparent substrate, a deformable layer and a conductive network pattern having a high aspect ratio such that at least one surface of the conductive network being exposed out of the deformable layer or the transparent substrate for contacting with an external structure while a large proportion thereof stays firmly integrated into the substrate. The present invention also relates to methods of fabricating a transparent conductive thin film including the structural features of the transparent conductive thin film of the present invention. Various optimizations of the present methods are also pro-
(Continued)

vided in the present invention for facilitating large area thin film fabrication and large scale production.

25 Claims, 4 Drawing Sheets

(51) Int. Cl.

| | | |
|---|---|---|
| C09D 133/02 | (2006.01) | |
| H01B 1/22 | (2006.01) | |
| C25D 5/02 | (2006.01) | |
| C08K 3/08 | (2006.01) | |
| C25D 5/54 | (2006.01) | |
| C25D 7/12 | (2006.01) | |
| H01L 51/42 | (2006.01) | |
| H01L 31/0224 | (2006.01) | |
| H01L 31/05 | (2014.01) | |
| H05K 3/20 | (2006.01) | |
| H01L 51/00 | (2006.01) | |

(52) U.S. Cl.
CPC ............... *C25D 5/022* (2013.01); *C25D 5/54* (2013.01); *C25D 7/12* (2013.01); *H01B 1/22* (2013.01); *H01L 31/022425* (2013.01); *H01L 31/0516* (2013.01); *H01L 51/003* (2013.01); *H01L 51/0023* (2013.01); *H01L 51/0097* (2013.01); *H01L 51/42* (2013.01); *H05K 3/207* (2013.01); *C08K 2003/0806* (2013.01); *Y02E 10/549* (2013.01)

(56) References Cited

U.S. PATENT DOCUMENTS

| | | | |
|---|---|---|---|
| 2013/0207911 A1* | 8/2013 | Barton | G06F 3/0488 |
| | | | 345/173 |
| 2014/0213013 A1 | 7/2014 | Britt et al. | |
| 2014/0224322 A1* | 8/2014 | Takeda | H01L 51/445 |
| | | | 136/256 |
| 2014/0291008 A1* | 10/2014 | Huang | H05K 1/0296 |
| | | | 174/268 |
| 2015/0216057 A1 | 7/2015 | Park et al. | |
| 2016/0225483 A1 | 8/2016 | Wu et al. | |
| 2016/0345430 A1 | 11/2016 | Khan et al. | |
| 2017/0345965 A1* | 11/2017 | Seo | B32B 7/02 |

FOREIGN PATENT DOCUMENTS

| | | |
|---|---|---|
| JP | 2010034538 A | 2/2010 |
| WO | 2011046775 A1 | 4/2011 |

OTHER PUBLICATIONS

Chao Chen et. al., "Fabrication of Silver Nanowire Transparent Conductive Films with an Ultra-Low Haze and Ultra-High Uniformity and Their Application in Transparent Electronics", Journal of Materials Chemistry C, 5, Jan. 31, 2017, p. 1-8.
Zongping Chen et. al., "Three-Dimensional Flexible and Conductive Interconnected Graphene Networks Grown by Chemical Vapour Deposition", Nature Materials, 10, Apr. 10, 2011, p. 424-428.
Jun Han et. al., "Fully Indium-free Flexible Ag Nanowires/ZnO:F Composite Transparent Conductive Electrodes with High Haze", Journal of Materials Chemistry A, 2015, 3, p. 1-40.
Z.L. Pei et. al., "Transparent Conductive ZnO:Al Thin Films Deposited on Flexible Substrates Prepared by Direct Current Magnetron Sputtering", Thin solid Films, 2006, 497, p. 20-23.
Yu Ze Chen et. al., "Low Temperature Growth of Graphene on Glass by Carbon-Enclosed Chemical Vapor Deposition Process and Its Application as Transparent Electrode", Chemistry of Materials, 2015, 27, 1636-1655, p. 1-30.
Zhaoyang Liu et. al., "Transparent Conductive Electrodes from Graphene/PEDOT:PSS Hybrid Inks for Ultrathin Organic Photodetectors", Advanced Materials, 2014, 10, p. 1-7.
Darren J. Lipomi et. al., "Electronic Properties of Transparent Conductive Films of PEDOT:PSS on Stretchable Substrates", Chemistry of Materials, 2012, 24, p. 373-382.
Hui Wu et. al., "A Transparent Electrode based on a Metal Nanotrough Network", Nature Nanotechnology, 2013, 8, p. 1-5.
European Search Report of EP2018166428 dated Sep. 10, 2018.

* cited by examiner

FLEXIBLE TRANSPARENT THIN FILM

CROSS-REFERENCE TO RELATED APPLICATIONS

This application is a Non-provisional Patent application claiming priority from the U.S. provisional Patent Application No. 62/483,321 filed Apr. 7, 2017; the disclosure of which is incorporated herein by reference in its entirety.

FIELD OF THE INVENTION

The present invention generally relates to conductive networks, transparent conductive films, flexible metal grid, thermal transfer processes, and particularly, transparent conductive electrode structures, and the methods of fabricating the same.

BACKGROUND

The disclosures of the following references are incorporated herein by reference in their entirety:

U.S. Pat. No. 9,244,356
U.S. Pat. No. 8,492,189
US 2016/0345430 A1
CN 104992752 A
US 2016/0225483 A1
CN 103864062 B
WO 2011/046775 A1
Won-Kyung Kim et al., Cu Mesh for Flexible Transparent Conductive Electrodes, Scientific Reports 5, Jun. 3, 2015, Article number: 10715;
Chao Chen et al., Fabrication of silver nanowire transparent conductive films with an ultra-low haze and ultra-high uniformity and their application in transparent electronics, J Mater. Chem. C, 5, 31, Jan. 2017, pp. 2240-2246;
Zongping Chen et al., Three-dimensional flexible and conductive interconnected graphene networks grown by chemical vapour deposition, Nature Materials 10, 10 Apr. 2011, pp. 424-428;
Han, J.; Yuan, S.; Liu, L.; Qiu, X.; Gong, H.; Yang, X.; Li, C.; Hao, Y.; Cao, B., Fully indium-free flexible Ag nanowires/ZnO:F composite transparent conductive electrodes with high haze, J. Mater. Chem. A 2015, 3, pp. 5375-5384;
Pei, Z. L.; Zhang, X. B.; Zhang, G. P.; Gong, J.; Sun, C.; Huang, R. F.; Wen, L. S., Transparent conductive ZnO:Al thin films deposited on flexible substrates prepared by direct current magnetron sputtering. Thin solid Films 2006, 497, 20-23;
Chen, Y. Z.; Medina, H.; Tsai, H. W.; Wang, Y. C.; Yen, Y. T.; Manikandan, A.; Chueh, Y. L. Low Temperature Growth of Graphene on Glass by Carbon-Enclosed Chemical Vapor Deposition Process and Its Application as Transparent Electrode. Chem. Mater. 2015, 27, 1636-1655;
Liu, Z.; Parvez, K.; Li, R.; Dong, R.; Feng, X.; Mullen, K. Transparent Conductive Electrodes from Graphene/PEDOT: PSS Hybrid Inks for Ultrathin Organic Photodetectors. Adv. Mater. 2015, 27, 669-675;
Lipomi, D. J.; Lee, J. A.; Vosgueritchian, M.; Tee, C. K.; Bolander, J. A.; Bao, Z. Electronic Properties of Transparent Conductive Films of PEDOT:PSS on Stretchable Substrates. Chem. Mater. 2012, 24, 373-382;
Wu, H.; Kong, D.; Ruan, Z.; Hsu, P. C.; Wang, S.; Yu, Z.; Carney, T. J.; Hu, L.; Fan, S.; Cui, Y. A transparent electrode based on a metal nanotrough network. Nat. Nanotechnol. 2013, 8, 421-425.

In a US patent under the patent number U.S. Pat. No. 8,492,189, a combinatorial or a two-step method for depositing transparent conductive oxide on a substrate, annealing and etching the same for improving the uniformity and initial texture of thin film photovoltaic solar cell is provided. However, notwithstanding the combinatorial or the two-step method, a relatively high annealing temperature is still required in that patent, which is greater than 200° C. Because PVD is employed for the deposition process, the cost on maintaining a constant temperature at such a relatively high level is still high.

In a US patent under the patent number U.S. Pat. No. 9,244,356, a method of using roll mask lithography (RML) to fabricate metal mesh structures is provided, where in certain embodiments a photoresist layer is deposited on a metal layer and patterned followed by etching to remove the metals exposed by openings. The metal mesh structure is formed after removing the photoresist. Other embodiments in that patent provide formation of metal mesh structure by depositing the metal materials onto a template that may be formed by coating a photoresist layer on a substrate followed by patterning using RML such that no etching is required. Either way cannot create a metal mesh structure that is partially integrated into the substrate while the remaining part is not but exposed out of the substrate for contacting with any potential external structure.

In a US patent application under the publication number US 2016/0225483 A1, a transparent conductive film comprising a transparent polymer that allows silver nanowires to partially dispersed therein was disclosed. Fused latex polymer particles were used to fuse with the interacted nanowires such that those embedded in the fused latex polymer retain excellent wire-to-wire contact while the rest of the nanowire not being embedded in the fused latex polymer has an improved conductivity. However, the fused latex polymer is not configured to embed nanowires with high aspect ratio. Also, the nanowires exposed outside the fused latex polymer are not in regular pattern or desired orientation because they are dispersed into the fused latex polymer particles.

In another US patent application under the publication number US 2016/0345430 A1, a transparent conductive film with a metal mesh embedded in a substrate and a method of fabrication thereof is provided, where the metal mesh has a cap that is pressed and embedded in a substrate or a deformable material on a substrate, providing superior mechanical stability by mechanical interlocking. Therefore, when the substrate is bent, the cap helps anchor the metal mesh in the substrate, keeping the metal mesh securely fastened and helping to improve its mechanical strength and stability. The fabrication method is vacuum-free, where the metal mesh is tapered in a direction that is opposite to the cap, and one surface of the resulting metal mesh is flush with the substrate surface. One problem of using that method arises from the additional cap which is required for the metal mesh to anchor in the substrate during bending. Because during the thermal imprinting or transfer from one substrate to the other, the cap of the metal mesh would make the surface of the substrate uneven when pressure is exerted from two platens of the hot press.

Consequently, there is an unmet need to have a transparent conductive thin film that has physical stability while flexibility to be further patterned or interact with any external structure without losing its optical, electrical and mechanical properties.

SUMMARY OF THE INVENTION

To solve the existing problems in the prior art, it is an objective of the present invention to provide novel and advantageous transparent conductive electrode structures and methods of fabricating thereof, which can be easily scaled up for mass production and are particularly useful in producing large area transparent conductive films (TCFs).

In the first aspect of the present invention, there is provided a transparent conductive film including a transparent substrate, a layer of deformable plastic, and a conductive network being integrated into the deformable plastic while at least one conductive surface thereof being exposed and having a high aspect ratio with a height-to-base ratio of no less than 1. In one embodiment, the transparent substrate is a flexible plastic film. In another embodiment, the at least one conductive surface of the conductive network can be roughened intrinsically or formed by other treatment processes. One of the advantages of having a high aspect ratio for the conductive network being integrated into the deformable plastic is to result in outstanding optical, electrical and mechanical properties, as compared to the conventional flexible transparent conductive films which use transparent conductive oxide materials as the transparent conductive substrate, e.g., indium tin oxide (ITO) and zinc oxide (ZnO). Exposing at least one conductive surface out of the deformable plastic allows higher flexibility for further patterning into different functional interconnect circuitry in any regular or irregular polygon pattern, e.g., square pattern, rectangle pattern, pentagon pattern, hexagon pattern, which can be repeating or non-repeating, or for contacting with various electronic devices or display panels with different applications because the exposed conductive surface forms a contact to the external structure while the conductive network stays firmly integrated into the deformable plastic. The conductive network can be metal-based, non-metal based, or made of a hybrid of metal and non-metal materials including but not limited to copper, nickel, gold, silver, tin, znic, graphene and/or carbon nanotube.

In the second aspect of the present invention, a non-vacuum and low-temperature method for fabricating the transparent conductive films of the present invention is provided. By the present method, no expensive vacuum equipment is required and a relatively low temperature is applied throughout the fabrication process, hence the production cost can be saved. In addition, the present method is suitable for fabricating large area transparent conductive films. The present method includes the following steps:

providing a first substrate;

forming a layer of removable resist material on the first substrate;

patterning a conductive network into the resist layer lithographically in order to form a trench grid network and to expose the lines to the external through the formed trench or trenches;

depositing conductive materials into the patterned grid of the resist layer by wet process or dry process until the deposited conductive materials reach a height corresponding to a height-to-base ratio of at least 1 in order to form the conductive network;

rinsing deposited conductive materials and removing the resist layer from the first substrate;

hot pressing the trench grid network or metal lines on the first substrate into a deformable layer on a second substrate at a temperature which is equal to or slightly higher/lower than the glass transition temperature (Tg) of the materials in any of the substrates or layers;

separating the second substrate from the first substrate with the conductive network pattern being transferred from the first substrate and thereby embedded into the second substrate under a transfer temperature in order to form the transparent conductive films of the present invention.

In an embodiment, said patterning lithographically includes but not limited to photolithography, nanoimprint lithography, e-beam lithography, etc. In another embodiment, said wet process for said depositing includes but not limited to electroplating, electrodeposition, electroless-deposition, etc. In other embodiment, said dry process for said depositing includes but not limited to sputtering, e-beam evaporation and thermal evaporation, etc. In yet another embodiment, said forming of said resist layer is by coating said removable resist materials onto said first substrate and said coating includes but not limited to spin-coating, slot-die coating, and spray coating. Said conductive network can be created on the substrate by direct deposition of the conductive materials such as ink-jet or screen printing process. In yet another embodiment, the first substrate includes but not limited to ITO glass, other transparent conductive oxide materials and other conductive materials; the second substrate includes but not limited to polymeric material which is also transparent and flexible. In certain embodiments, said depositing includes sealing edges of the first substrate in order to avoid deposition of the conductive materials at the edges of the first substrate such that defect is reduced and uniformity is improved, rendering higher efficiency in transferring the conductive network from the first substrate to the second substrate. In certain embodiments, the temperature used during said hot pressing and throughout the transfer of the conductive network pattern from the first substrate to the second substrate can be 0-30 degrees higher or slightly lower than the Tg of the materials of the first or second substrate in order to avoid defects caused by, e.g., optical or mechanical degradation arising from said pressing or during the transfer. The overall temperature used throughout the present method can range from 50 to 450° C. in the cases of using the polymers such as polyethylene terephthalate (PET), polyvinyl chloride (PVC), cyclic olefin copolymer (COC), cyclic olefin polymer (COP), polyethylene-naphthalate (PEN), Polycarbonate (PC), polymethyl methacrylate (PMMA), Polyimide (PI) and Triacetate Cellulose (TAC). The present method is fully operable in the absence of any vacuum process. However, vacuum deposition can still be used for performing said depositing of conductive materials into the patterned grid, if necessary. The as-fabricated transparent conductive films according to certain embodiments of the present invention can have sheet resistance of less than 1 Ω/☐ and optical transparency of more than 90% while the films remain sufficiently flexible for fitting into all kinds of electronic devices or display panel or even deformable objects, and no additional additives are required to increase the transparency of the conductive films fabricated according to the present method.

BRIEF DESCRIPTION OF THE DRAWINGS

Embodiments of the present invention are described in more detail hereinafter with reference to the drawings, in which.

DETAILED DESCRIPTION OF PREFERRED EMBODIMENTS

In the following description, the composition or structure of the present transparent conductive films and methods of fabrication thereof, and the corresponding embodiments are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Exemplary Embodiments

The elements and various embodiments of the present invention are demonstrated herein by way of examples as described below.

EXAMPLE 1

Structure of the Transparent Conductive Film

Figure 1:
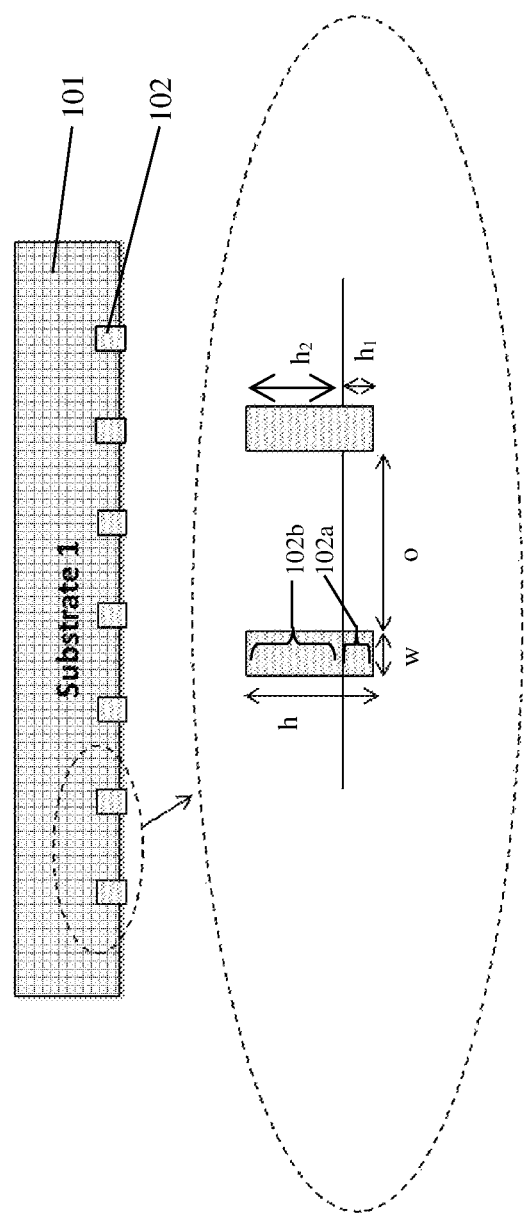
FIG. 1 is a schematic diagram showing the basic structure of a transparent conductive film according to an embodiment of the present invention.

In FIG. 1, the structure of the transparent conductive film fabricated according to various embodiments of the present invention including an enlarged view of a surface of the transparent substrate (101), wherein a conductive network (102) is integrated into a layer of deformable plastic (not shown in FIG. 1 as it is removed in the as-fabricated film) with at least one conductive surface being exposed out of the deformable plastic layer as a contact to the external is provided. From the enlarged view, the height of the conductive network that is formed as a line pattern is determined based on a specific high aspect ratio. The main purposes of using such a high aspect ratio for patterning each line pattern of the conductive network are 1.) to provide sufficient contact surface for forming a good anchor on substrate 1 (101) for the integration of conductive network and/or 2.) to provide a high optical transmittance on the TCFs as for the same electrical conductivity, a higher aspect ratio will enhance the transparency and 3.) to provide a good electrical conductivity by forming a large cross section area on the conductive network for the same optical transparency and 4.) to provide a protrusion (102a) with a sufficient protrusion height which is exposed out of the transparent substrate or deformable plastic layer in order to increase the flexibility of further patterning functional interconnect circuity on different surfaces of the protrusion. In certain embodiments, an aspect ratio (r) of height-to-base width (h:w) is at least 1. Since still there is a large proportion in terms of the height of the conductive network line embedded in the transparent substrate or the deformable plastic layer (102b), it makes the conductive network stable when being subjected to further patterning or processing. As it can be seen from this example that each of the conductive network line patterns has a base width (w) between 0.5 microns and 10 microns; an opening (o) between conductive network lines is between 1 micron and 1,000 microns; the height (h) of each conductive network line is between 0.5 and 10 microns. As to the protrusion, the protrusion height ($h_1$) is from 0 to 5 microns. Preferably, the protrusion height is from more than 0 micron to 5 microns. The remaining height ($h_2$) of the conductive network line is the height of the conductive network being integrated into the deformable plastic layer or the transparent substrate. The conductive network can be formed by electrochemical processes, vacuum deposition process, or other solution deposition process (e.g., electroless plating, etc.). Surface of the conductive network can be roughened which can be produced during deposition or by wet etching using chemicals such as acids, bases, or by dry etching process. Examples of materials used for forming the conductive network include but not limited to metals, semiconductor materials, conductive polymers and conductive oxides. In certain embodiments, the transparent substrate is a flexible plastic film. Examples of materials used for the transparent substrate include but not limited to polyethylene terephthalate (PET), polyvinyl chloride (PVC), cyclic olefin copolymer (COC), cyclic olefin polymer (COP), polyethylene-naphthalate (PEN), Polycarbonate (PC), polymethyl methacrylate (PMMA), Polyimide (PI) and Triacetate Cellulose (TAC). The deformable plastic can be a light plastic or a thermal curable material.

EXAMPLE 2

Methods of Fabricating the Transparent Conductive Film

Figure 2:
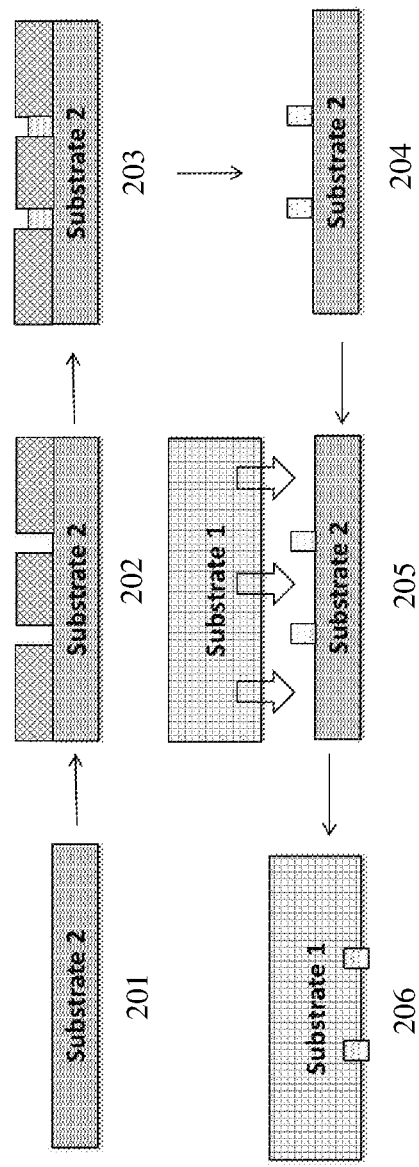
FIG. 2 is a schematic flow diagram of the method of fabricating the transparent conductive film according to an embodiment of the present invention.

As illustrated in FIG. 2, the method of fabricating the transparent conductive film in accordance to various embodiments of the present invention generally comprises: providing and cleaning a first substrate, which is itself conductive or contains a conductive layer (201); forming a layer of removable resist on the first substrate (not shown in FIG. 2); patterning conductive network in line structures lithographically (202) such that a trench grid network is formed and the conductive network is exposed through the trench or trenches as-formed; depositing conductive materials (203) by wet processing and dry processing approaches to form the conductive network lines; rinsing and removing the resist layer from the first substrate (204); hot pressing the trench grid network or metal lines on the first substrate into a deformable layer on a second substrate at a temperature which is equal to or slightly higher/lower than the glass transition temperature (Tg) of the materials in any of the substrates or layers such that the conductive network lines embedded into the deformable plastic layer is transferred from the first substrate to the second structure (205); separating the second substrate from the first substrate with the conductive network line patterns being transferred from the first substrate and embedded into the second substrate in order to form the transparent conductive films of the present invention (206).

Not shown in FIG. 2, prior to deposition of conductive materials into the trench grid pattern to form line structures, the edges of the first substrate are sealed to avoid unnecessary deposition of the conductive materials at the edges in order to reduce defect and improve uniformity so as to increase the efficiency during the transfer of the conductive network from the first substrate to the second substrate. Deposition of the conductive materials is preferably carried out by non-vacuum process such as electrochemical deposition, electroplating, electroless deposition, etc. However, vacuum deposition process may be used for deposition of the conductive materials in the present invention, if necessary.

The temperature used for the hot pressing and/or the transfer of the conductive network from the first substrate to the second substrate according to certain embodiments of the present invention ranges from 50° C. to 450° C., or is slight lower than, equal to or 0-30° C. higher than Tg of any of the substrates used in this example. Same temperature as or a slightly different temperature (higher or lower) from the hot pressing temperature can be used throughout the transfer step.

Also not shown in FIG. 2, prior to said hot pressing, the method may include a plasma treatment for the surface of the first and/or the second substrates.

It should be understood that the present method can be used for large scale production and is particularly suitable for large area transparent conductive film. One of the problems in fabricating large area transparent conductive film is that the pressure exerted by the hot press cannot be applied uniformly to the substrates, which results in an unflatten surface. To address this problem, several adaptations can be made to optimize the present method so as to provide a uniform pressure to the substrates during hot pressing and/or the transfer steps. One or more additional press pad(s) is(are) inserted between the hot press platen and the surface of the substrate where it is originally in contact with the hot press. Said one or more additional press pad(s) is/are flat and hard layer(s) that can be metal substrates.

Figure 3:
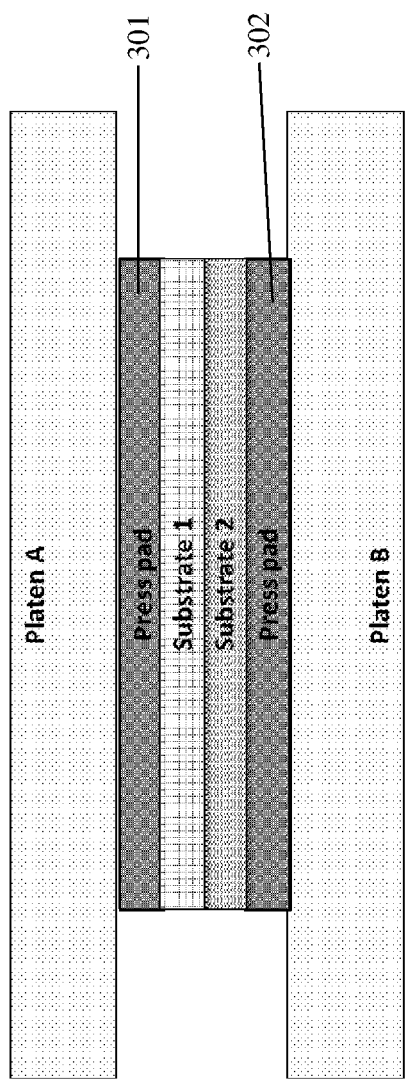
FIG. 3 shows an example of how the present method is optimized for large area transparent conductive film fabrication according to an embodiment of the present invention.

For example, in FIG. 3, additional hard and flat press pads (301, 302) are inserted between each platen and each substrate in order for delivering uniform pressure across the substrate during the transfer of the conductive network from one substrate to the other. This optimization to the present method is capable of handling large area transparent conductive film, e.g., 5 cm×5 cm or larger.

Figure 4:
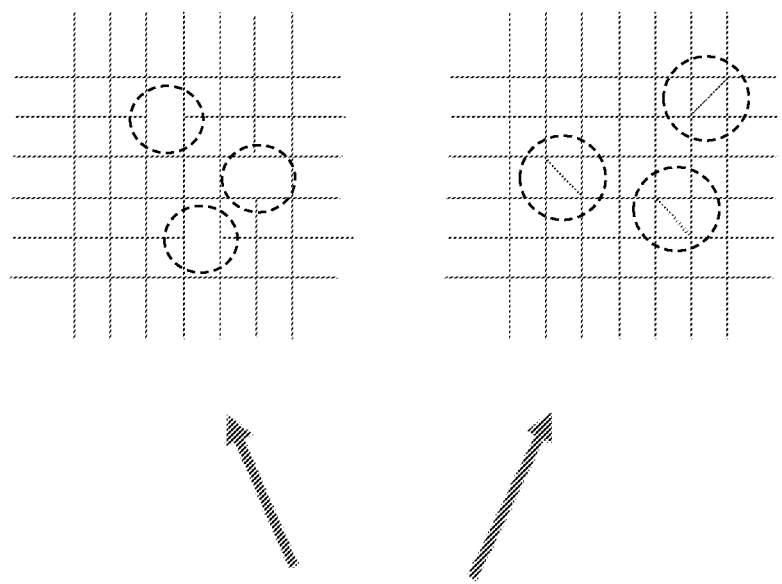
FIG. 4 shows an example that by introducing an irregular polygon pattern on a surface of the transparent conductive film according to an embodiment of the present invention, moire pattern due to optical interference by viewing from a distance can be eliminated.

FIG. 4 schematically shows an example of introduction of irregular patterning to reduce the moire effect due to viewing of the substrate from a distance. In this example, a periodic polygon pattern is introduced with an irregular polygon pattern in order to suppress optical interference. The irregular polygon patterns are represented by dashed line circles in FIG. 4. An irregular pattern can be introduced through out the whole or part of the film or as a repeating unit.

The present method is simple and easy to scale up. It also has an advantage that the formation of the second substrate and the formation of the conductive network can be done substantially at the same time since the second substrate is made of a material such as polymeric material that can be thermally cured at the temperature within the range of the hot pressing temperature.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

INDUSTRIAL APPLICABILITY

The present transparent conductive film is useful in producing large area flexible electronic and optoelectronic devices or display panels which require certain functionalities from the conductive part of the film. The protrusion of the conductive network in the present transparent conductive film allows certain flexibility for further manipulation for different functions while they remain firmly integrated into the transparent substrate.

What is claimed is:

1. A transparent conductive film comprising:
   at least one transparent substrate;
   and
   a conductive network being integrated into said at least one transparent substrate and having a high aspect ratio with a protrusion exposed out of said at least one transparent substrate for contacting with an external structure,
   wherein said conductive network is surface-roughened to result in a rough surface.

2. The transparent conductive film of claim 1, wherein said high aspect ratio is determined by a height-to-base width ratio of at least 1.5.

3. The transparent conductive film of claim 1, wherein said protrusion is with a height from more than 0 to 5 microns.

4. The transparent conductive film of claim 1, wherein said conductive network is patterned in a plurality of line structures with a height from 0.5 to 10 microns and with a base width from 0.5 micron to 10 microns.

5. The transparent conductive film of claim 4, wherein between any two of the line structures of the conductive network pattern has an opening between 1 and 1,000 microns.

6. An electronic device comprising the transparent conductive film of claim 1 or being interconnected via said protrusion of the conductive network of said transparent conductive film.

7. The transparent conductive film of claim 1, wherein the protrusion has a height (h1) which is determined by the height of the line structures of the conductive network pattern (h) minus the height of the lines structures that is embedded into a second substrate (h2); and wherein the height of the line structures (h) corresponds to the aspect ratio of the conductive network pattern which is determined by the height-to-base width ratio (r) of at least 1.

8. The transparent conductive film of claim 7, wherein the height of the protrusion (h1) is from more than 0 to 5 microns.

9. The transparent conductive film of claim 1, wherein said conductive network is either metal-based, based on a hybrid of metal and non-metal materials, or non-metal based, comprising copper, nickel, gold, silver, tin, zinc, graphene and/or carbon nanotube.

10. The transparent conductive film of claim 1, wherein said conductive network is patterned to have a regular or irregular polygon shape comprising triangle, rectangle, pentagon, hexagon and other polygons.

11. The transparent conductive film of claim 10, wherein said irregular pattern is introduced to a periodic polygon pattern in order to suppress optical interference.

12. The transparent conductive film of claim 1, wherein said at least one transparent substrate comprises PET, PVC, COC, COP, PEN, PMMA, PI, PC and TAC.

13. A method for fabricating the transparent conductive film of claim 1, comprising:
   providing a first substrate;
   forming a layer of removable resist layer on said first substrate;

patterning a conductive network pattern in said removable resist layer lithographically such that a trench grid network is formed and a plurality of line structures is exposed through the trench or trenches;

depositing conductive materials into said trench or trenches to form said conductive network until each of the line structures reaches a height corresponding to an aspect ratio;

rinsing and removing said removable resist layer from said first substrate;

hot pressing said conductive network from the first substrate into a deformable plastic layer of a second substrate at a temperature which is equal to or slightly higher/lower than the glass transition temperature (Tg) of the materials in any of the substrates or layers;

separating the second substrate from the first substrate with the conductive network pattern being transferred from the first substrate and thereby embedded into the second substrate under a transfer temperature in order to form the transparent conductive film with a protrusion being exposed out of the second substrate, wherein said conductive network is surface-roughened during or after said depositing by wet or dry etching to result in a rough surface.

14. The method of claim 13, wherein said at least one of said first and second substrates comprises PET, PVC, COC, COP, PEN, PMMA, PI, PC and TAC.

15. The method of claim 13, wherein said patterning lithographically comprises photolithography, nanoimprint lithography, and e-beam lithography.

16. The method of claim 13, wherein said depositing is carried out by wet or dry process comprising electroplating, electrodeposition, electroless-deposition, sputtering, e-beam evaporation and thermal evaporation, or by direct deposition comprising ink-jet printing and screen printing.

17. The method of claim 13, wherein forming of said resist layer is by coating said removable resist materials onto said first substrate and said coating comprises spin-coating, slot-die coating, and spray coating.

18. The method of claim 13, wherein said first substrate comprises indium tin oxide (ITO) glass, or other transparent conductive oxide materials or other conductive materials.

19. The method of claim 13, wherein said second substrate comprises polymeric material which is transparent and flexible.

20. The method of claim 13, wherein prior to said depositing, said method further comprises sealing edges of the first substrate in order to avoid deposition of the conductive materials at the edges of the first substrate such that defect is reduced and uniformity is improved, rendering higher efficiency in transferring the conductive network from the first substrate to the second substrate.

21. The method of claim 13, wherein the temperature used during said hot pressing and throughout the transfer of the conductive network pattern from the first substrate to the second substrate is 0-30 degrees higher than the Tg of the material of the first or second substrate.

22. The method of claim 13, wherein prior to said hot pressing, the first substrate and/or second substrate is surface-treated by plasma.

23. The method of claim 13, wherein prior to said hot pressing, said method further comprises inserting a flat and hard layer comprising metal substrates between the platen of the hot press and the adjacent substrate for applying pressure uniformly across the substrate during hot pressing.

24. The method of claim 13, wherein the protrusion has a height (h1) which is determined by the height of the line structures of the conductive network pattern (h) minus the height of the lines structures that is embedded into the second substrate (h2); and wherein the height of the line structures (h) corresponds to the aspect ratio of the conductive network pattern which is determined by the height-to-base width ratio (r) of at least 1.5.

25. The method of claim 24, wherein the height of the protrusion (h1) is from more than 0 to 5 microns.

* * * * *